United States Patent
Chen et al.

(10) Patent No.: US 9,449,666 B2
(45) Date of Patent: Sep. 20, 2016

(54) LOCAL WORD LINE DRIVER

(71) Applicants: Chung-Kuang Chen, Hsinchu (TW);
Han-Sung Chen, Hsinchu (TW);
Chun-Hsiung Hung, Hsinchu (TW)

(72) Inventors: Chung-Kuang Chen, Hsinchu (TW);
Han-Sung Chen, Hsinchu (TW);
Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 630 days.

(21) Appl. No.: 13/713,829

(22) Filed: Dec. 13, 2012

(65) Prior Publication Data

US 2013/0148445 A1     Jun. 13, 2013

Related U.S. Application Data

(63) Continuation-in-part of application No. 12/785,297, filed on May 21, 2010, now Pat. No. 8,363,505.

(30) Foreign Application Priority Data

Dec. 17, 2009   (TW) .............................. 098143429 A

(51) Int. Cl.
G11C 8/08       (2006.01)
G11C 7/12       (2006.01)

(52) U.S. Cl.
CPC .. *G11C 8/08* (2013.01); *G11C 7/12* (2013.01)

(58) Field of Classification Search
CPC .................................. G11C 8/08; G11C 7/12
USPC ................................................... 365/189.15
See application file for complete search history.

(56) References Cited

U.S. PATENT DOCUMENTS

| | | | |
|---|---|---|---|
| 4,085,498 A | | 4/1978 | Rideout |
| 4,737,936 A | | 4/1988 | Takeuchi |
| 5,808,500 A | * | 9/1998 | Kalpakjian .................... 327/321 |
| 6,025,751 A | | 2/2000 | Chiang et al. |
| 6,611,451 B1 | * | 8/2003 | Houston ............... G11C 11/418 365/154 |
| 7,177,226 B2 | | 2/2007 | Lee |
| 8,072,834 B2 | * | 12/2011 | Khamesra et al. ...... 365/230.06 |
| 2004/0141362 A1 | * | 7/2004 | Sumitani et al. ............. 365/154 |
| 2007/0030738 A1 | | 2/2007 | Oh |
| 2007/0278554 A1 | | 12/2007 | Song et al. |
| 2008/0144389 A1 | | 6/2008 | Chen et al. |
| 2010/0142306 A1 | * | 6/2010 | Nakamura ............. G11C 5/145 365/227 |

FOREIGN PATENT DOCUMENTS

TW        200837762 A        9/2008

\* cited by examiner

*Primary Examiner* — Douglas King
(74) *Attorney, Agent, or Firm* — Haynes Beffel & Wolfeld LLP

(57) ABSTRACT

A memory circuit with a word line driver and control circuitry is disclosed. The plurality of word line drivers are coupled to a plurality of word lines. Word line drivers include a CMOS inverter, which can have an input and an output, and a p-type transistor and an n-type transistor. The output of the CMOS inverter is coupled to one of the plurality of word lines. The control circuitry has multiple modes, including at least a first mode to discharge a particular word line of the plurality of word lines via a first discharge path such as at least a first transistor type of the CMOS inverter; and a second mode to discharge the particular word line of the plurality of word lines via a second discharge path such as at least the a second transistor type of the CMOS inverter.

27 Claims, 18 Drawing Sheets

| Read | select | deselect | deselect | deselect |
|---|---|---|---|---|
| GWL | HV | HV | 0 | 0 |
| PP | -V | HV | -V | HV |
| NVSS | 0 | 0 | 0 | 0 |
| WL | HV | 0 | 0 | 0 |

| Read | select | deselect | deselect | deselect |
|---|---|---|---|---|
| GWL | HV | HV | 0 | 0 |
| PP | -V | HV | -V | HV |
| NVSS | 0 | 0 | 0 | 0 |
| WL | HV | 0 | 0 | 0 |

Fig. 4

| Program | select | deselect | deselect | deselect |
|---|---|---|---|---|
| GWL | HV | HV | 0 | 0 |
| PP | +V | HV | +V | HV |
| NVSS | 0 | 0 | 0 | 0 |
| WL | HV | 0 | 0 | 0 |

Fig. 5

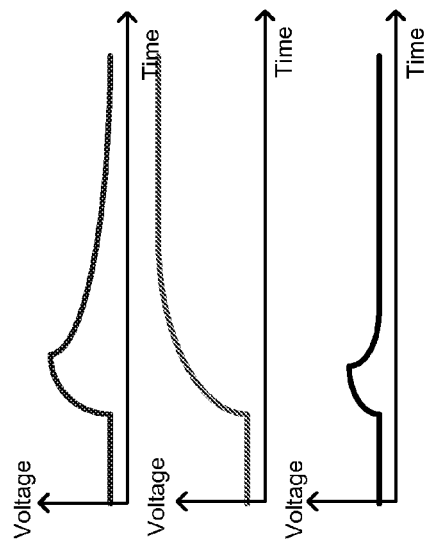
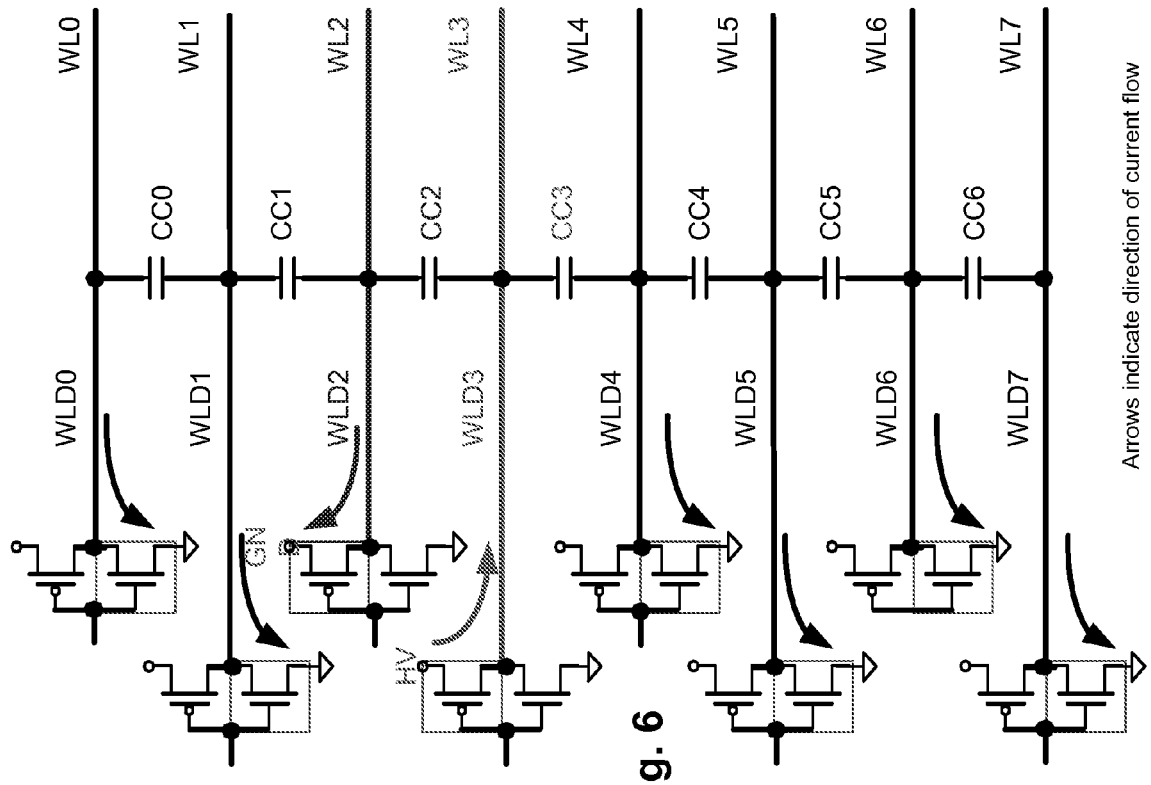
Fig. 7
Fig. 6

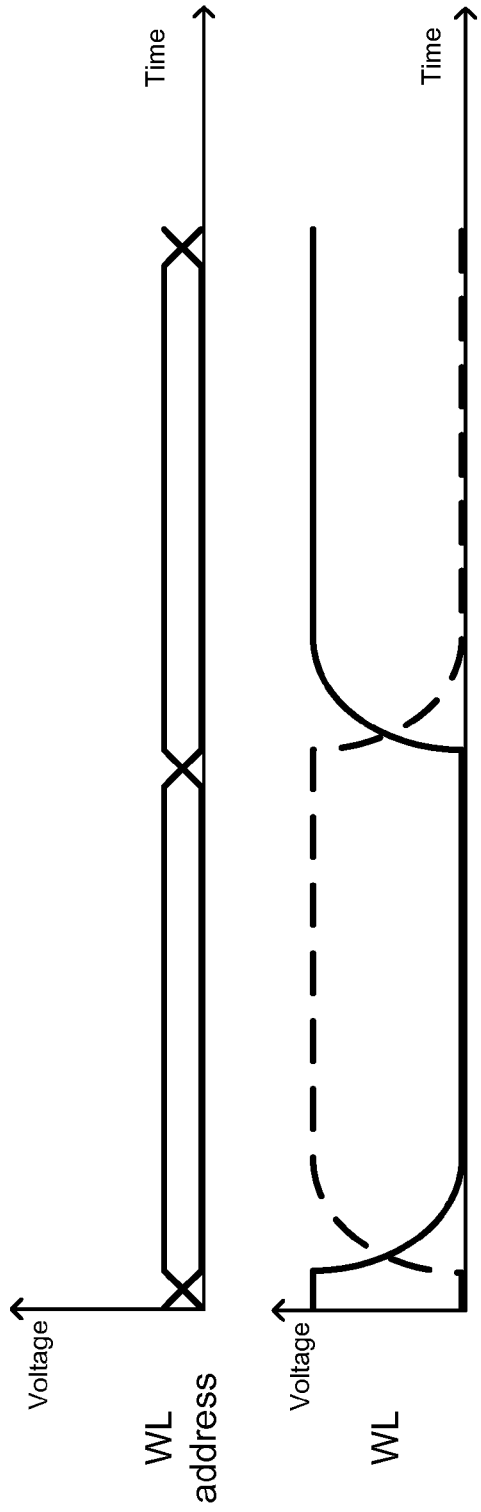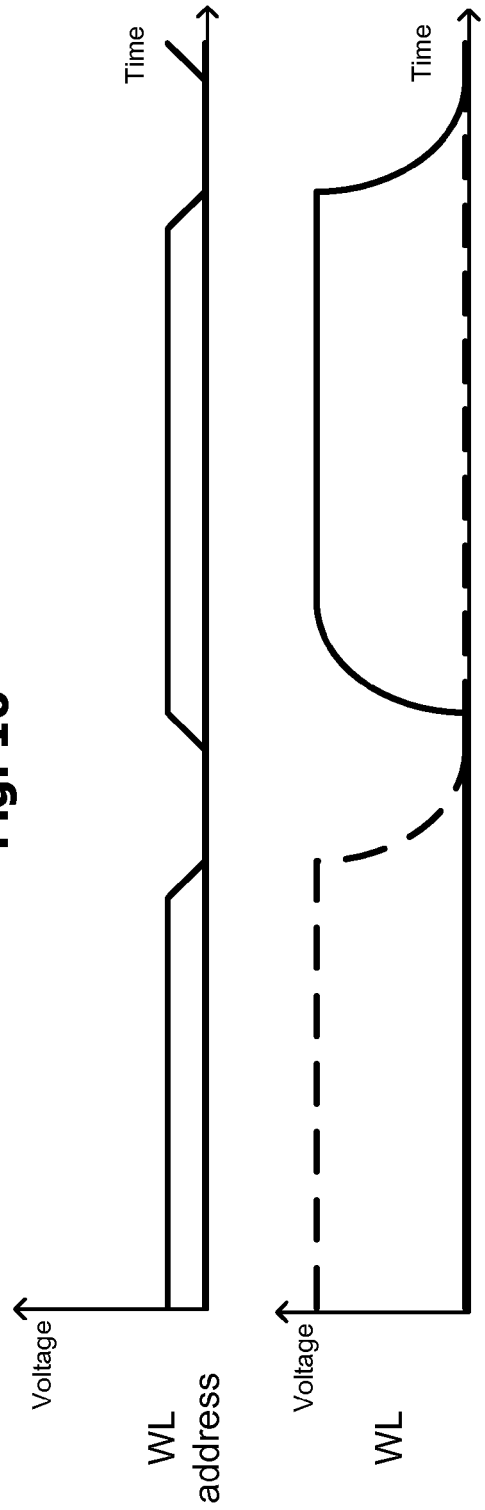

2T Driver (1 per Row)

|      | Read/PGM |        |        | ERS   |        |
|------|----------|--------|--------|-------|--------|
|      | SEL      | DE-SEL | DE-SEL | SEL   | DE-SEL |
| NWD  | AVXP     | AVXP   | AVXP   | AVXP  | AVXP   |
| GWL  | AVXP     | 0V     | AVXP   | 0V    | 0V     |
| PP   | -2V      | -2V    | AVXP   | AVXP  | AVXP   |
| NVS  | 0V       | 0V     | 0V     | -V    | 0V     |
| WL   | AVXP     | 0V     | 0V     | -V    | 0V     |

Fig. 17

|      | Read/PGM |        |        | ERS   |        |
|------|----------|--------|--------|-------|--------|
|      | SEL      | DE-SEL | DE-SEL | SEL   | DE-SEL |
| NWD  | AVXP     | AVXP   | AVXP   | AVXP  | AVXP   |
| GWL  | AVXP     | 0V     | AVXP   | 0V    | 0V     |
| PP   | 0V       | 0V     | AVXP   | AVXP  | AVXP   |
| NVS  | 0V       | 0V     | 0V     | -V    | 0V     |
| WL   | AVXP     | 0V     | 0V     | -V    | 0V     |

Fig. 18

|  | Read | | | PGM | | | ERS | |
|---|---|---|---|---|---|---|---|---|
|  | SEL | DE-SEL | DE-SEL | SEL | DE-SEL | DE-SEL | SEL | DE-SEL |
| NWD | AVXRD | AVXRD | AVXRD | AVXHV | AVXHV | AVXHV | AVXEV | AVXEV |
| GWL | AVXRD | 0V | AVXRD | AVXHV | 0V | AVXHV | 0V | 0V |
| PP | AVXNV | AVXNV | AVXRD | AVXNV | AVXNV | AVXHV | AVXEV | AVXEV |
| NVS | 0V | 0V | 0V | 0V | 0V | 0V | NV | 0V |
| WL | AVXRD | 0V | 0V | AVXHV | 0V | 0V | NV | 0V |

Fig. 19

LOCAL WORD LINE DRIVER

REFERENCE TO RELATED APPLICATION

This application is a continuation-in-part of U.S. application Ser. No. 12/785,297, filed on 21 May 2010 (now U.S. Pat. No. 8,363,505) entitled Local Word Line Driver, which is incorporated herein by reference.

BACKGROUND

1. Field of the Invention

The technology relates to memory integrated circuits, in particular the word line driver of a memory integrated circuit.

2. Description of Related Art

Memory integrated circuits access memory cells with word lines powered by word line drivers. With the continuing trend towards decreasing die size and more stringent power requirements, two transistor, or 2T, word line drivers are another alternative.

However, in known 2T word line drivers, the transistor gate dielectric undergoes great electric field stress. For example, the 2T word line driver design of US Patent Application Publication 2011/0149675 requires negative input bias, to turn on the p-type transistor of the 2T word line driver when discharging a word line through the p-type transistor of the 2T word line driver. Without the negative input bias on the 2T word line driver design, the p-type transistor of the 2T word line driver fails to remain on long enough to discharge the word line to ground.

SUMMARY

One aspect of the technology is a memory circuit. The memory circuit includes a plurality of word line drivers and control circuitry.

The plurality of word line drivers are coupled to a plurality of word lines. Word line drivers include a CMOS inverter, which can have an input and an output, and a p-type transistor and an n-type transistor. The output of the CMOS inverter is coupled to one of the plurality of word lines.

The control circuitry has multiple modes, including at least a first mode to discharge a particular word line of the plurality of word lines via at least a first transistor type of the CMOS inverter; and a second mode to discharge the particular word line of the plurality of word lines via at least a second transistor type of the CMOS inverter. The second transistor type us different from the first transistor type, such as p-type and n-type.

During a memory operation (such as read) on a selected word line of the plurality of word lines, the control circuitry is configured to deselect the particular word line adjacent to the selected word line, via the second mode and not the first mode. This decreases the duration of time in which a deselected word line proximate to the selected word line has an unwanted voltage due to capacitive coupling between the selected word line and the deselected word line.

A further aspect of the technology is a method of operating memory, as follows.

During a memory operation on a selected word line of a plurality of word lines, a particular word line adjacent to the selected word line is deselected. The control circuitry of the memory has multiple modes of discharging the particular word line. In the first mode the control circuitry is configured to discharge the particular word line of the plurality of word lines via a first discharge path of a word line driver of a plurality of word line drivers. In the second mode the control circuitry is configured to discharge the particular word line of the plurality of word lines via a second discharge path of the CMOS inverter of the word line driver of the plurality of word line drivers. The second discharge path is different from the first discharge path. In the method, the particular word line adjacent to the selected word line is deselected, via not the first mode of control circuitry but via the second mode of the control circuitry.

Various embodiments of these aspects of the technology are discussed below.

In one embodiment of the technology, during the memory operation, the control circuitry prevents discharge of the particular word line via only the p-type transistor of a particular word line driver of the plurality of word line drivers. The particular word line driver coupled to the particular word line. For transistors of comparable size, discharge through the p-type transistor is slower than discharge through the n-type transistor. Discharge of deselected word lines is faster by preventing discharge through only the p-type transistor.

In one embodiment of the technology, during the memory operation, the control circuitry reads one or more memory cells coupled to the selected word line.

In one embodiment of the technology, during the memory operation, the control circuitry does not read memory cells coupled to the particular word line.

In one embodiment of the technology, a first reference voltage is coupled to the p-type transistor of the CMOS inverter. The first reference voltage is received from a global word line.

In one embodiment of the technology, in the CMOS inverter of the word line drivers, the p-type transistor has a current carrying terminal receiving a first voltage reference signal having one of a first reference value and a second reference value. The first reference value is greater than the second reference value. The n-type transistor has a current carrying terminal receiving a second voltage reference signal. The word line driver is configured to receive multiple deselect signals, any of which is sufficient to deselect the corresponding word line. The control circuitry is configured to deselect word lines of the plurality of word lines by applying first voltage reference signals to the current carrying terminals of p-type transistors in the plurality of the word line drivers. Also, the control circuitry is configured to deselect word lines of the plurality of word lines by applying input signals to inputs of CMOS inverters in the plurality of the word line drivers.

In one embodiment of the technology, during the memory operation, the control circuitry is configured to select the selected word line of the plurality of word lines by coupling the selected word line to the first reference value via a word line driver of the plurality of word line drivers, and deselect word lines adjacent to the word line by coupling the adjacent word lines to the second voltage reference signal via word line drivers of the plurality of word line drivers. This arrangement can discharge the deselected word lines through at least the n-type transistor of the corresponding word line drivers.

In one embodiment of the technology, the selected word line is coupled to a word line driver of the plurality of word lines drivers, and the selected word line is charged to the read voltage, responsive to the first voltage reference signal and the second voltage reference signal.

In one embodiment of the technology, the particular word line is deselected to perform a read operation on one or more memory cells not coupled to the particular word line.

In one embodiment of the technology, the selected word line is selected to perform a read operation on one or more memory cells coupled to at least the selected word line.

The control circuitry of a particular word line driver is capable of discharging through only the p-type transistor at one time, only the n-type transistor at another time, and both the p-type transistor and the n-type transistor at yet another time. Because of the layout area and Vgs bias, the driving capability of the p-type transistor is weaker than the n-type transistor. So discharge speed through just the p-type transistor is slower than through just n-type transistor, and discharge speed through just the p-type transistor is slower than through both the n-type transistor and the p-type transistor at the same time.

In a read or program operation, when one or more word lines that were previously deselected that become selected are then turned on, one or more word lines that were previously selected that become deselected are then turned off. One or more word lines are being charged at the same time as one or more other word lines are being discharged. If a discharging word line is discharged through a p-type transistor, the word line discharge transient is slower than a charging word line's charging time. Accordingly, in some embodiments, the word lines are discharged by n-type transistors prior to charging a selected word line.

Yet another aspect of the technology is a memory circuit. The memory circuit includes a plurality of word line drivers coupled to a plurality of word lines. Word line drivers in the plurality include a p-type transistor and an n-type transistor. The p-type transistor and the n-type transistor are electrically coupled together as a CMOS inverter. The CMOS inverter has an input and an output coupled to a word line of the plurality of word lines.

The p-type transistor of the CMOS inverter has a current carrying terminal receiving a first voltage reference signal. The first voltage reference signal has one of a first reference value and a second reference value. The first reference value is greater than the second reference value. The n-type transistor of the CMOS inverter has a current carrying terminal receiving a second voltage reference signal.

The control circuitry is configured to deselect word lines of the plurality of word lines via any of multiple signals. The control circuitry is configured to deselect word lines by applying first voltage reference signals to the current carrying terminals of p-type transistors in the plurality of the word line drivers. The control circuitry is also configured to deselect word lines of the plurality of word lines by applying input signals to inputs of CMOS inverters in the plurality of the word line drivers.

During a memory operation, the control circuitry is configured to deselect a particular word line adjacent to a selected word line, by coupling the particular word line to the second voltage reference signal via a word line driver of the plurality of word line drivers.

In one embodiment of the technology, during the memory operation, the control circuitry is configured to deselect the particular word line by coupling the particular word line to the second voltage reference signal via at least the n-type transistor of the second word line driver adjacent to the word line driver.

In the various aspects of the technology, consecutive operations changing a word line voltage of the word line are separated by sufficient time to discharge the word line.

Various embodiments of multiple aspects of the technology are disclosed herein.

BRIEF DESCRIPTION OF THE DRAWINGS

FIG. 4 is a table of example read bias arrangements for nodes of the 2T word line driver shown in FIG. 1.

FIG. 5 is a table of example program bias arrangements for nodes of the 2T word line driver shown in FIG. 1.

FIG. 6 is a simplified figure of an array of 2T word line drivers, showing a selected word line undergoing charging, and adjacent deselected word lines capacitively coupled to the selected word line that discharge primarily through the n-type transistor or p-type transistor of an inverter in the 2T word line driver.

FIG. 7 is a simplified figure of an array of voltage vs. time graphs for 3 of the 2T word line drivers in FIG. 6, showing a selected word line undergoing charging to a program voltage, and adjacent deselected word lines capacitively coupled to the selected word line that discharge at different rates, depending on the discharging transistor.

FIG. 10 is a graph of voltage versus time for a word line address signal and a word line voltage, without delay between consecutive communications of multiple word line addresses.

FIG. 11 is a graph of voltage versus time for a word line address signal and a word line voltage, with a delay between consecutive communications of multiple word line addresses.

FIG. 17 is a table of an example bias arrangement for the five nodes of the 2T word line driver shown in FIG. 1.

FIG. 18 is a table of another example bias arrangement for the five nodes of the 2T word line driver shown in FIG. 2.

FIG. 19 is a table of yet anther example bias arrangement for the 2T word line driver, with a generalized negative voltage.

DETAILED DESCRIPTION

Figure 1:
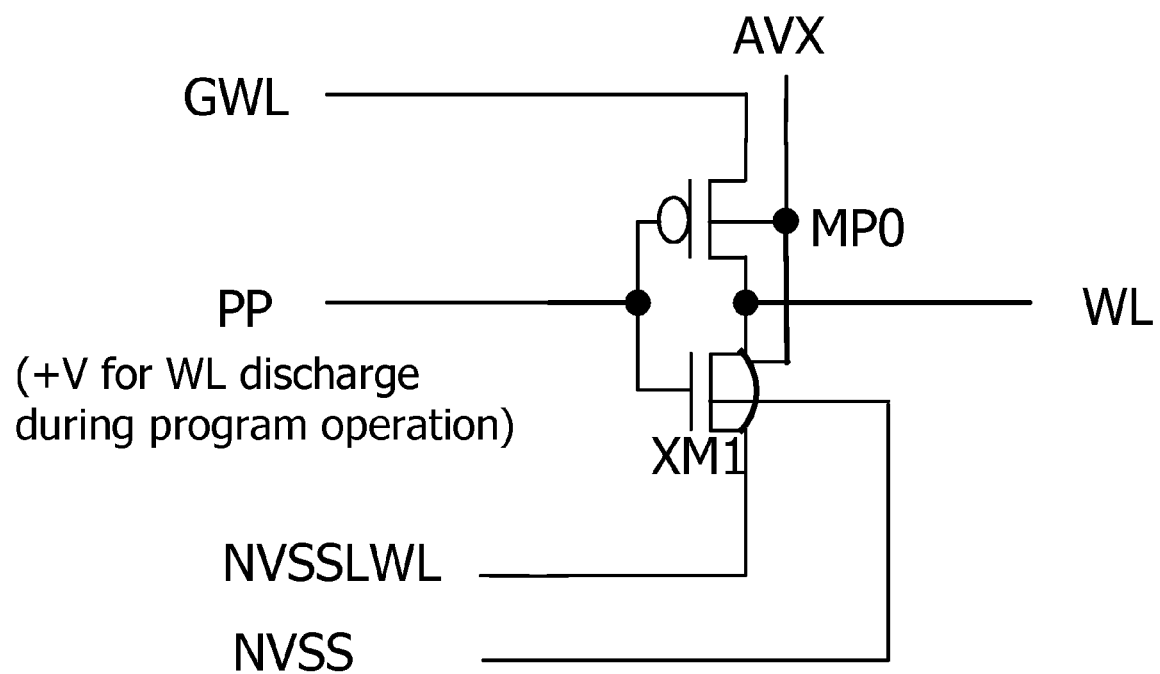
FIG. 1 shows a circuit diagram of a 2T word line driver as an example of the technology with an inverter including an n-type transistor and a p-type transistor, where during a program operation the input of the inverter receives a positive voltage to discharge a word line coupled to the output of the inverter.

FIG. 1 shows a circuit diagram of a 2T word line driver as an example of the technology with an inverter including an n-type transistor and a p-type transistor, where during a program operation the input of the inverter receives a positive voltage to discharge a word line coupled to the output of the inverter.

One 2T word line driver is coupled to one word line in the memory array. Transistor MP0 is a p-type transistor. Transistor XM1 is an n-type transistor. Both transistors have a source and a drain which are the current carrying terminals, and a gate. The gates of p-type transistor MP0 and n-type transistor XM1 are electrically connected to each other, and to signal PP which is one of two address signals selecting a particular word line controlled by a particular word line driver. The drains of p-type transistor MP0 and n-type transistor XM1 are electrically connected to each other, and to the word line WL driven by the word line driver. The source of p-type transistor MP0 is electrically connected to signal GWL, which is another one of two address signals selecting a particular word line controlled by a particular word line driver. The source of n-type transistor XM1 is electrically connected to signal NVSSLWL. Signal NVSS is electrically connected to the p-well of the n-type transistor XM1. The p-well of the n-type transistor XM1 is formed in an n-well, in which the p-type transistor MP0 is formed.

Figure 2:
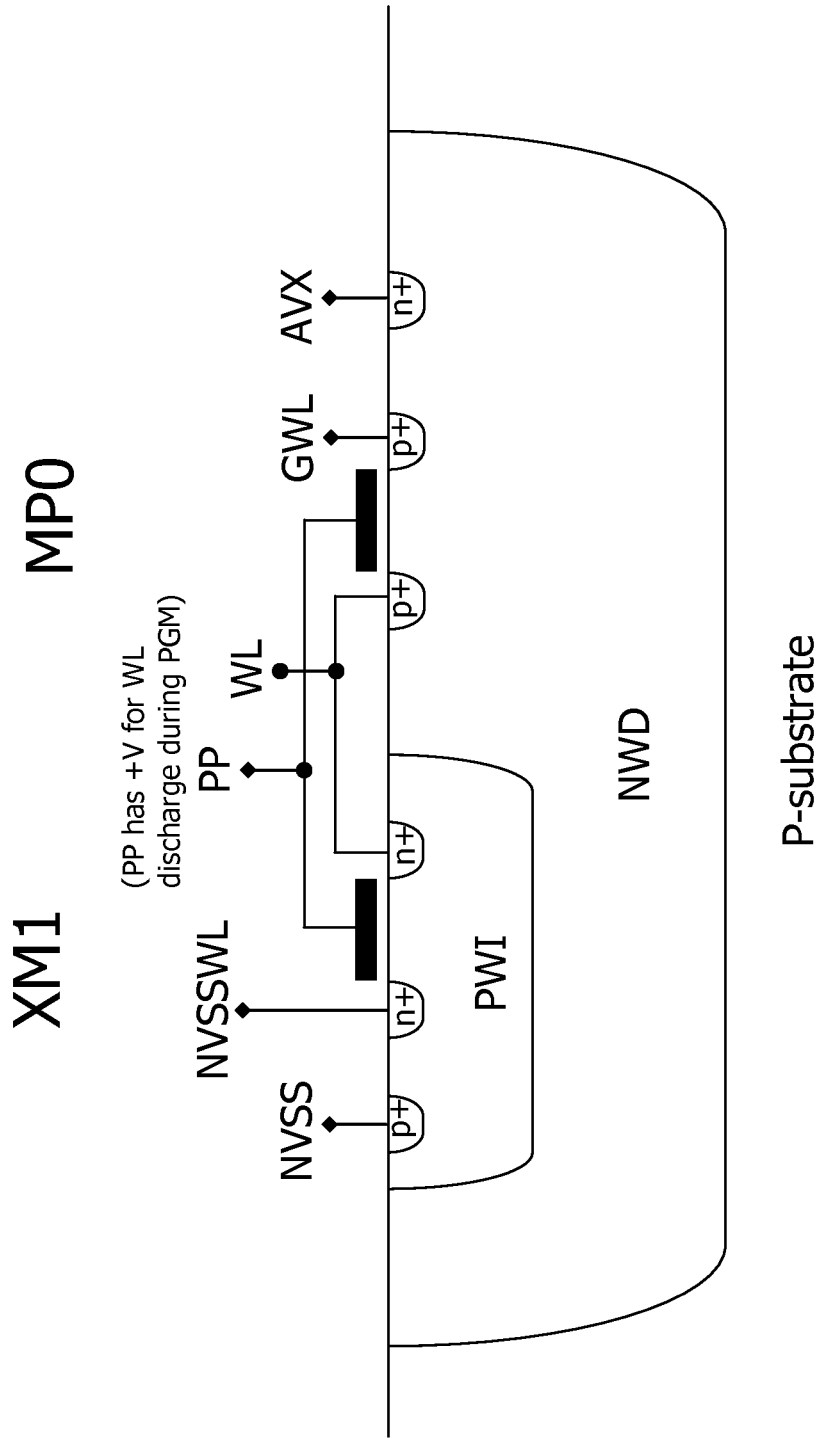
FIG. 2 is a depth cross-section of the 2T word line driver of FIG. 1, showing nodes of the 2T word line driver.

FIG. 2 is a depth cross-section of the 2T word line driver of FIG. 1, showing nodes of the 2T word line driver. The p-well implant PWI in the n-well diffusion NWD is shown. The n-well diffusion NWD is formed in the p-type substrate. The n-type transistor XM1 is formed in the p-well implant PWI. The p-type transistor MP0 is formed in the n-well diffusion NWD.

Figure 3:
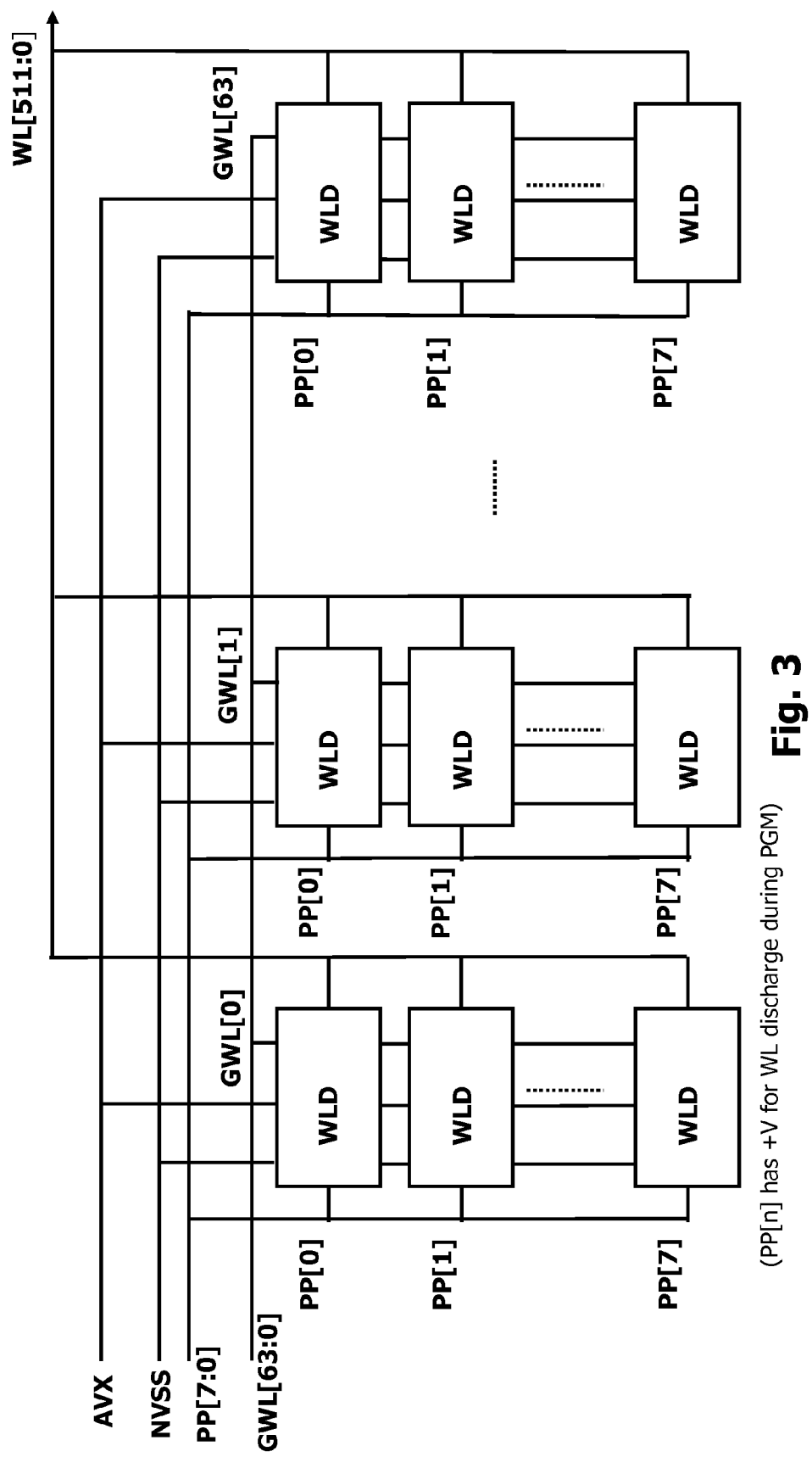
FIG. 3 is a simplified block diagram of an array of 2T word line drivers shown in FIG. 1, receiving the signals from multiple lines at nodes of the 2T word line drivers in the array, such that the signals select a particular 2T word line driver that drives a particular word line in the subsequent array of word lines.

FIG. 3 is a simplified block diagram of an array of 2T word line drivers shown in FIG. 1. Signals from multiple lines select a particular 2T word line driver that drives a particular word line in the subsequent array of word lines. The preceding array of global word line drivers select proximate groups of word line drivers via signals GWL[63:0]. As shown, each global word line signal (e.g., GWL[0], GWL[1], . . . GWL[63]) selects a group of 8 word line drivers. Within each such group of word line drivers, particular word line drivers are selected by signals PP[7:0].

Accordingly, a particular word line driver column shares the same GWL signal but has different PP signals within a column. A particular word line driver row shares the same PP signal but has different GWL signals within a row. The subsequent array of word lines (not shown) are controlled by the output signals of the array of 2T word line drivers, WL[511:0]. Other embodiments vary the number of signals and the number of elements controlled by the signals.

This example addressing arrangement selects a particular 2T word line driver from the array, and deselects other 2T word lines driver according to multiple separate address lines. Both signal PP and signal GWL select a particular word line corresponding to a particular word line driver.

FIG. 4 is a table of example read bias arrangements for nodes of the 2T word line driver shown in FIG. 1.

During a read operation, word lines are deselected by applying a reference signal such as 0V as the GWL signal. Also, word lines are deselected by applying a reference signal such as HV, a high positive voltage, as the PP signal. Word lines are selected by applying a reference signal such as HV, a high positive voltage, as the GWL signal; and by applying a negative voltage −V as the PP signal.

FIG. 5 is a table of example program bias arrangements for nodes of the 2T word line driver shown in FIG. 1.

During a program operation, word lines are deselected by applying a reference signal such as 0V as the GWL signal. Also, word lines are deselected by applying a reference signal such as HV, a high positive voltage, as the PP signal. Word lines are selected by applying a reference signal such as HV, a high positive voltage, as the GWL signal; and by applying a positive voltage +V as the PP signal.

One of the deselect voltage arrangements for a word line driver applies a reference signal such as 0V as the GWL signal, and a positive voltage +V as the PP signal. This voltage arrangement turns on both the n-type transistor to discharge the word line to NVSS (in this example, 0V), and the p-type transistor to discharge the word line to GWL (in this example, 0V).

In the deselect voltage arrangements for a word line driver that apply a reference signal such as HV, a high positive voltage, as the PP signal, the word line discharges through the n-type transistor.

FIG. 6 is a simplified figure of an array of 2T word line drivers, showing a selected word line undergoing charging, and adjacent deselected word lines capacitively coupled to the selected word line that discharge primarily through the n-type transistor or p-type transistor of an inverter in the 2T word line driver.

Word line drivers WLD0, . . . WLD7 control respective word lines WL0, . . . WL7. Adjacent word lines are capacitively coupled together, such that a voltage change on a particular word line results in a voltage change on an adjacent word line. Accordingly, when a particular word line is selected for an operation such as program, the adjacent word lines are deselected to counteract capacitively coupling from the selected word line.

FIG. 7 is a simplified figure of an array of voltage vs. time graphs for 3 of the 2T word line drivers in FIG. 6, showing a selected word line undergoing charging to a program voltage, and adjacent deselected word lines capacitively coupled to the selected word line that discharge at different rates, depending on the discharging transistor.

Word line WL3 is selected for an operation such as program. Accordingly, word line driver WLD3 charges word line WL3 to high voltage HV through the p-type transistor of word line driver WLD3. Due to capacitive coupling, the adjacent word lines WL2 and WL4 also increase in voltage. Word line WL4 is discharged through the n-type transistor of word line driver WLD4. Word line WL2 is discharged through the p-type transistor of word line driver WLD2. For a particular gate width, a p-type transistor is less efficient than an n-type transistor. Accordingly, word line WL2 being discharged through a p-type transistor has a longer transient than word line WL4 being discharged through an n-type transistor.

Figure 8:
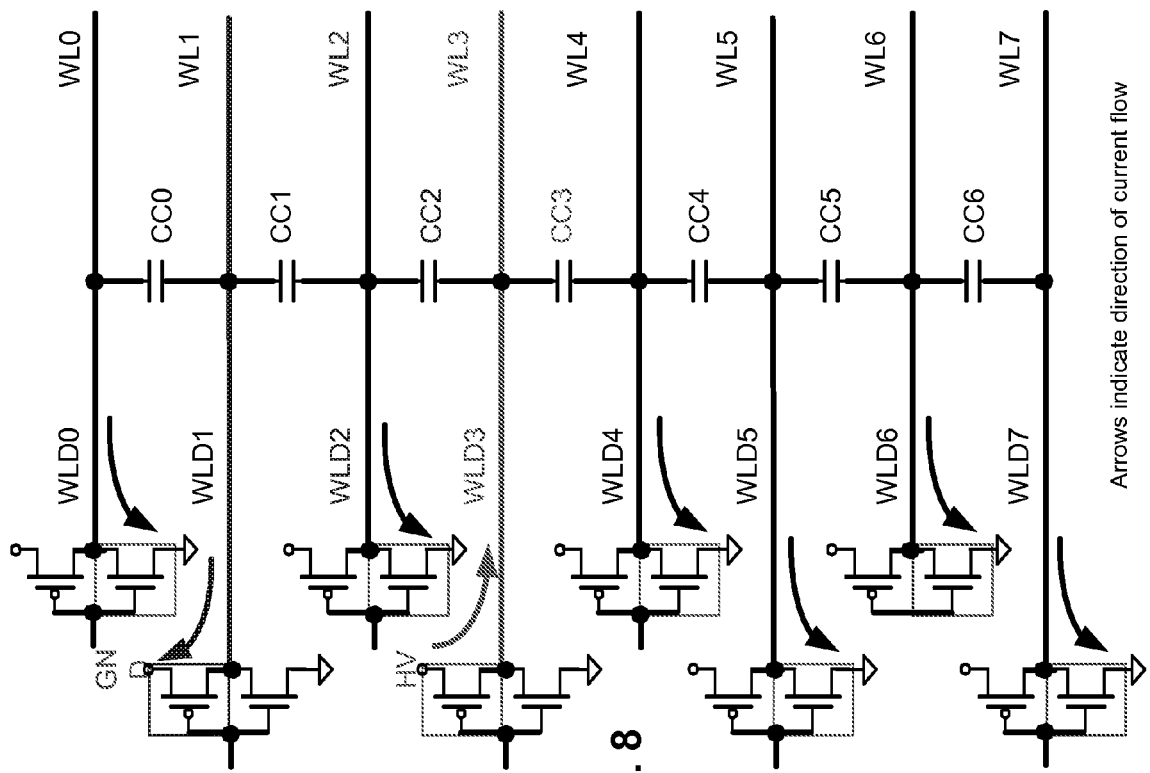
FIG. 8 is a simplified figure of an array of 2T word line drivers, showing a selected word line undergoing charging, and adjacent deselected word lines capacitively coupled to the selected word line that discharge primarily through the n-type transistor of an inverter in the 2T word line driver.

FIG. 8 is a simplified figure of an array of 2T word line drivers, showing a selected word line undergoing charging, and adjacent deselected word lines capacitively coupled to the selected word line that discharge primarily through the n-type transistor of an inverter in the 2T word line driver.

Figure 9:
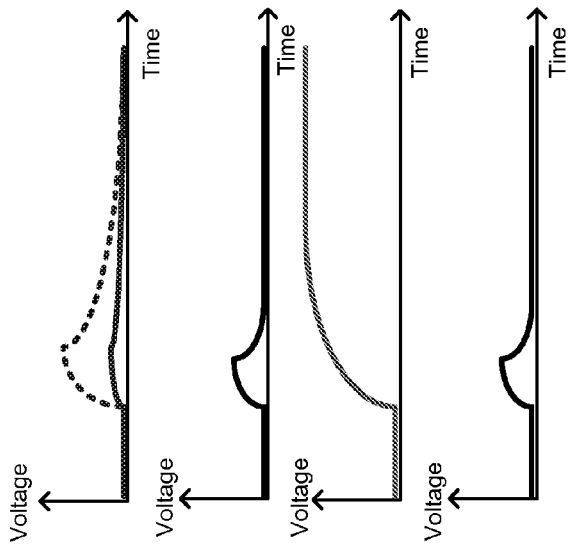
FIG. 9 is a simplified figure of an array of voltage vs. time graphs for 3 of the 2T word line drivers in FIG. 8, showing a selected word line undergoing charging to a program voltage, and adjacent deselected word lines capacitively coupled to the selected word line that discharge primarily through the n-type transistor of an inverter in the 2T word line driver.

FIG. 9 is a simplified figure of an array of voltage vs. time graphs for 3 of the 2T word line drivers in FIG. 8, showing a selected word line undergoing charging to a program voltage, and adjacent deselected word lines capacitively coupled to the selected word line that discharge primarily through the n-type transistor of an inverter in the 2T word line driver.

Similar to FIGS. 6-7, word line WL3 is selected for an operation such as program. However, in contrast with FIGS. 6-7, the adjacent word lines WL2 and WL4 both drain through respective n-type transistors. Accordingly, both the transient for word line WL2 and the transient for word line WL4 are relatively brief.

FIG. 10 is a graph of voltage versus time for a word line address signal and a word line voltage, without delay between consecutive communications of multiple word line addresses.

The graph of word line address voltage versus time shows that word line addresses are communicated consecutively, without intervening delay. The graph of word line voltage versus time shows that, before deselected word lines have sufficient time to discharge completely, the selected word line is charged for the operation such as program.

FIG. 11 is a graph of voltage versus time for a word line address signal and a word line voltage, with a delay between consecutive communications of multiple word line addresses.

The graph of word line address voltage versus time shows that word line addresses are communicated, without an intervening delay between word line addresses. The graph of word line voltage versus time shows that, deselected word lines have sufficient time to discharge, before the selected word line is charged for the operation such as program. For example, the n-type transistor of a word line driver such as the n-type transistor XM1 of the word line driver in FIG. 1, can assist the p-type transistor, such as the p-type transistor MP0 of the word line driver in FIG. 1, with discharging a deselected word line.

Figure 12:
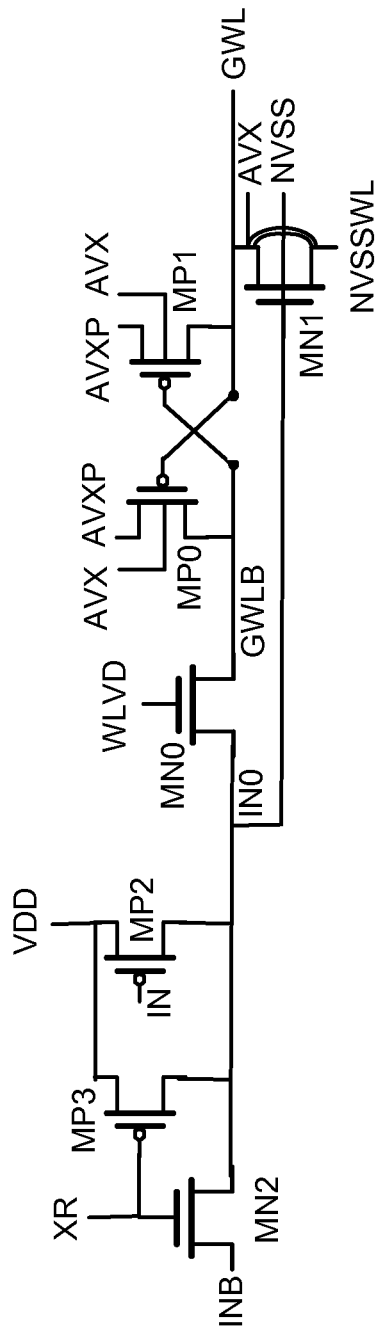
FIG. 12 is a simplified circuit diagram of a global word line driver.

FIG. 12 is a simplified circuit diagram of a global word line driver, such as one generating a GWL signal in FIG. 2 or 3.

N-type transistor MN2 has a gate coupled to signal XR, and current carrying terminals coupled to signals INB and node IN0.

P-type transistor MP3 has a gate coupled to signal XR, and current carrying terminals coupled to power VDD and node IN0.

P-type transistor MP3 has a gate coupled to signal IN (complement of IN), and current carrying terminals coupled to power VDD and node IN0.

N-type transistor MN0 has a gate coupled to signal WLVD, and current carrying terminals coupled to node IN0 and node GWLB.

P-type transistor MP0 has a gate coupled to node GWL, and current carrying terminals coupled to power AVXP and node GWLB.

P-type transistor MP1 has a gate coupled to node GWLB (complement of GWL), and current carrying terminals coupled to power AVXP and node GWL.

P-type transistors MP0 and MP1 have a body coupled to power AVX.

N-type transistor MN1 has a gate coupled to node IN0, and current carrying terminals coupled to node GWL power AVXP and power NVSSWL. N-type transistor MN1 also has a body coupled to NVSSWL and a well coupled to power AVX.

Figure 13:
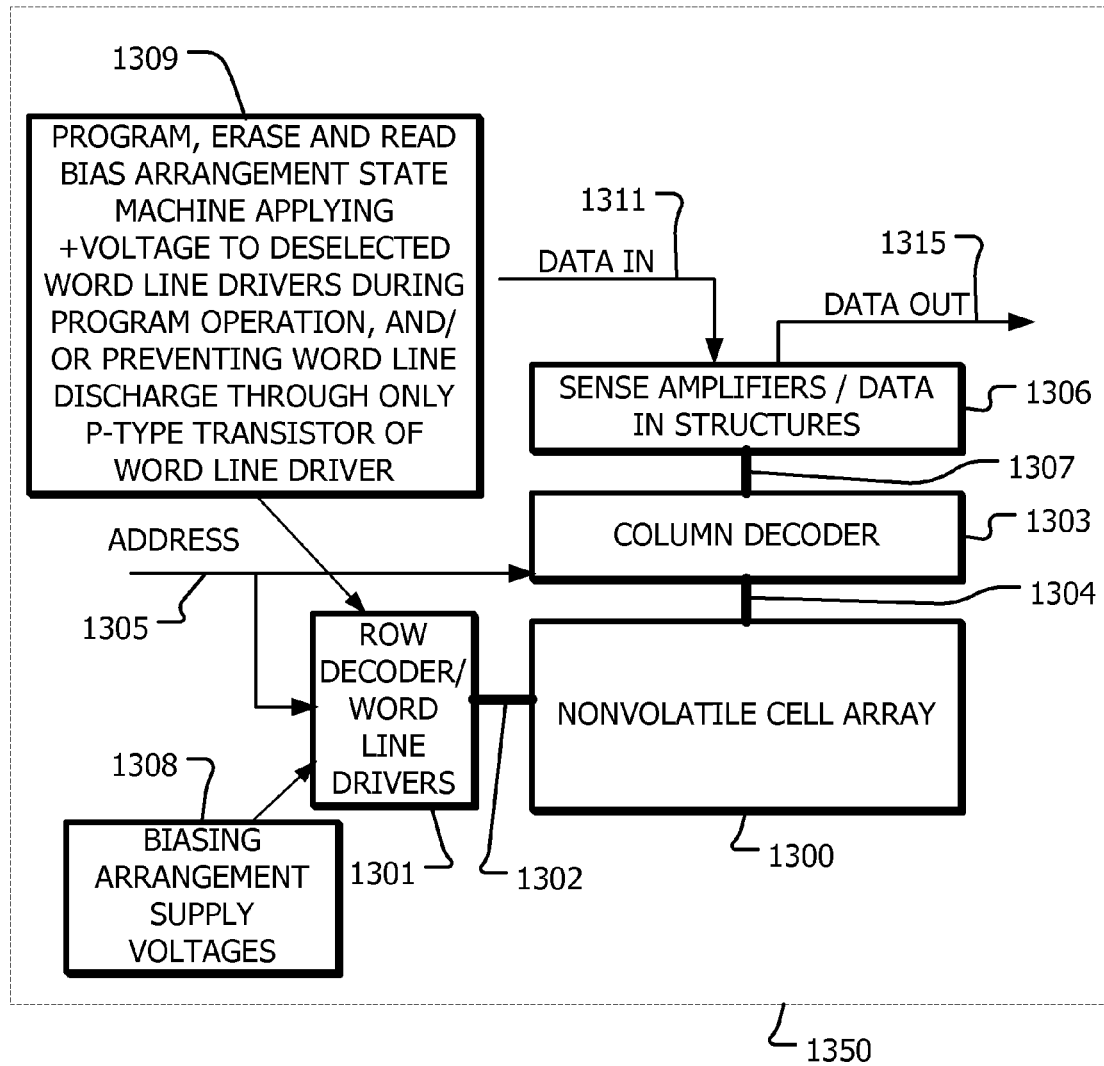
FIG. 13 is a simplified block diagram of an integrated circuit including a memory array implemented using any of the 2T word line driver improvements as described herein.

FIG. 13 is a simplified block diagram of an integrated circuit including a memory array implemented using any of the 2T word line driver improvements as described herein.

An integrated circuit 1350 including a memory array 1300. A word line (or row) and block select decoder 1301 is coupled to, and in electrical communication with, a plurality 1302 of word lines and string select lines, and arranged along rows in the memory array 1300. A bit line (column) decoder and drivers 1303 are coupled to and in electrical communication with a plurality of bit lines 1304 arranged along columns in the memory array 1300 for reading data from, and writing data to, the memory cells in the memory array 1300. Addresses are supplied on bus 1305 to the word line decoder and drivers 1301 and to the bit line decoder 1303. Sense amplifiers and data-in structures in block 1306, including current sources for the read, program and erase modes, are coupled to the bit line decoder 1303 via the bus 1307. Data is supplied via the data-in line 1311 from input/output ports on the integrated circuit 1350, to the data-in structures in block 1306. Data is supplied via the data-out line 1315 from the sense amplifiers in block 1306 to input/output ports on the integrated circuit 1350, or to other data destinations internal or external to the integrated circuit 1350. State machine circuitry 1309 controls biasing arrangement supply voltages 1308. State machine circuitry 1309 applies positive voltage to deselected word line drivers during an operation such as program. State machine circuitry 1309 also prevents discharge of a deselected word line through only the p-type transistor of a word line drive.

Figure 14:
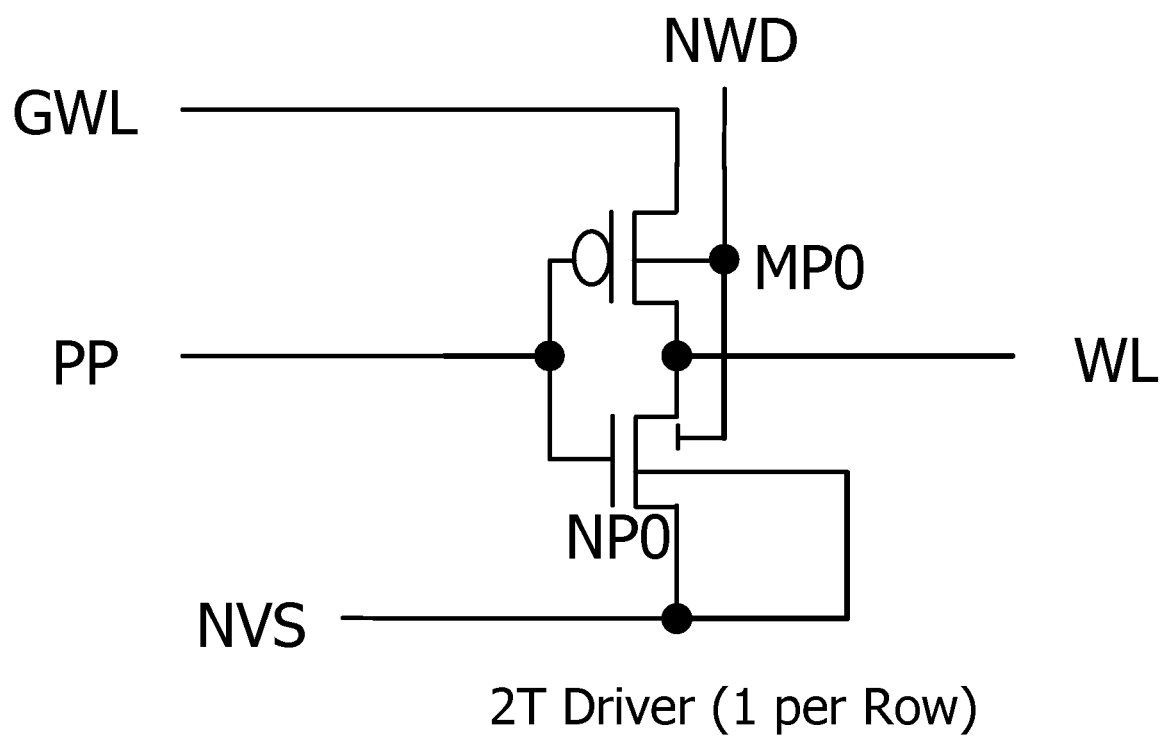
FIG. 14 shows a circuit diagram of a 2T word line driver as an example of the technology with an n-type transistor and a p-type transistor, where the p-type transistor to turns on with only negative gate voltage.

FIG. 14 shows a circuit diagram of a 2T word line driver as an example of the technology with an n-type transistor and a p-type transistor, where the p-type transistor to turns on with only negative gate voltage.

One 2T word line driver corresponds to one word line in the memory array.

Transistor MP0 is a p-type transistor. Transistor NP0 is an n-type transistor. Both transistors have a source and a drain which are the current carrying terminals, and a gate. The gates of p-type transistor MP0 and n-type transistor NP0 are electrically connected to each other, and to signal PP which is one of two address signals selecting a particular word line corresponding to a particular word line driver. The drains of p-type transistor MP0 and n-type transistor NP0 are electrically connected to each other, and to the word line WL driven by this word line driver. The source of p-type transistor MP0 is electrically connected to signal GWL, which is another one of two address signals selecting a particular word line corresponding to a particular word line driver. The source of n-type transistor NP0 is electrically connected to signal NVS; signal NVS is also electrically connected to the p-well of the n-type transistor NP0. The p-well of the n-type transistor NP0 is formed in an n-well, in which the p-type transistor MP0 is formed. This n-well is electrically connected to signal NWD.

Figure 15:
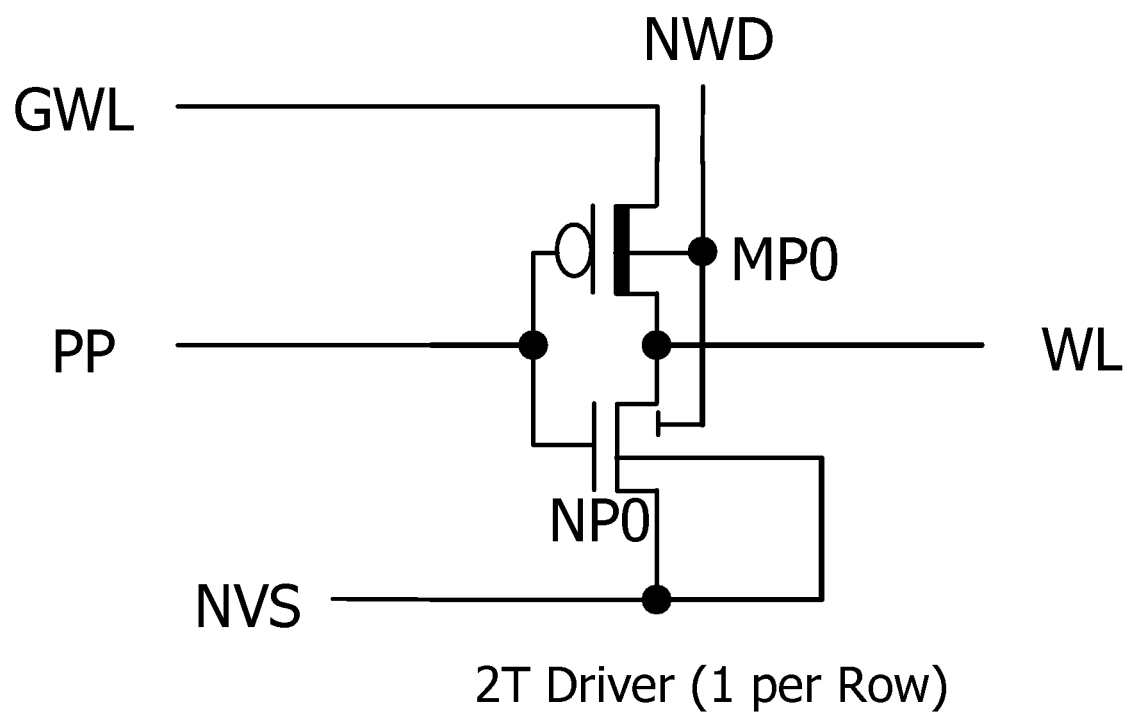
FIG. 15 shows a circuit diagram of a 2T word line driver as an example of the technology with an n-type transistor and a depletion mode p-type transistor, where the p-type transistor turns on with non-positive gate voltage.

FIG. 15 shows a circuit diagram of a 2T word line driver as an example of the technology with an n-type transistor and a p-type transistor, where the p-type transistor turns on with non-positive gate voltage. FIG. 15 is similar to FIG. 14. However, the symbol for the p-type transistor MP0 indicates a depletion mode device rather than an enhancement device. Accordingly, the depletion mode p-type transistor MP0 of FIG. 15 is on at 0V on the gate, whereas the enhancement mode p-type transistor MP0 of FIG. 14 is off at 0V on the gate. More particularly, the depletion mode p-type transistor MP0 of FIG. 15 is on at least at 0V and at negative voltages on the gate, and turns off with some positive voltage range on the gate, and some transition between 0V and this positive voltage range. The enhancement mode p-type transistor MP0 of FIG. 14 is off at 0V and at positive voltages on the gate, and turns on with some negative voltage range on the gate, and some transition between 0V and this negative voltage range.

Figure 16:
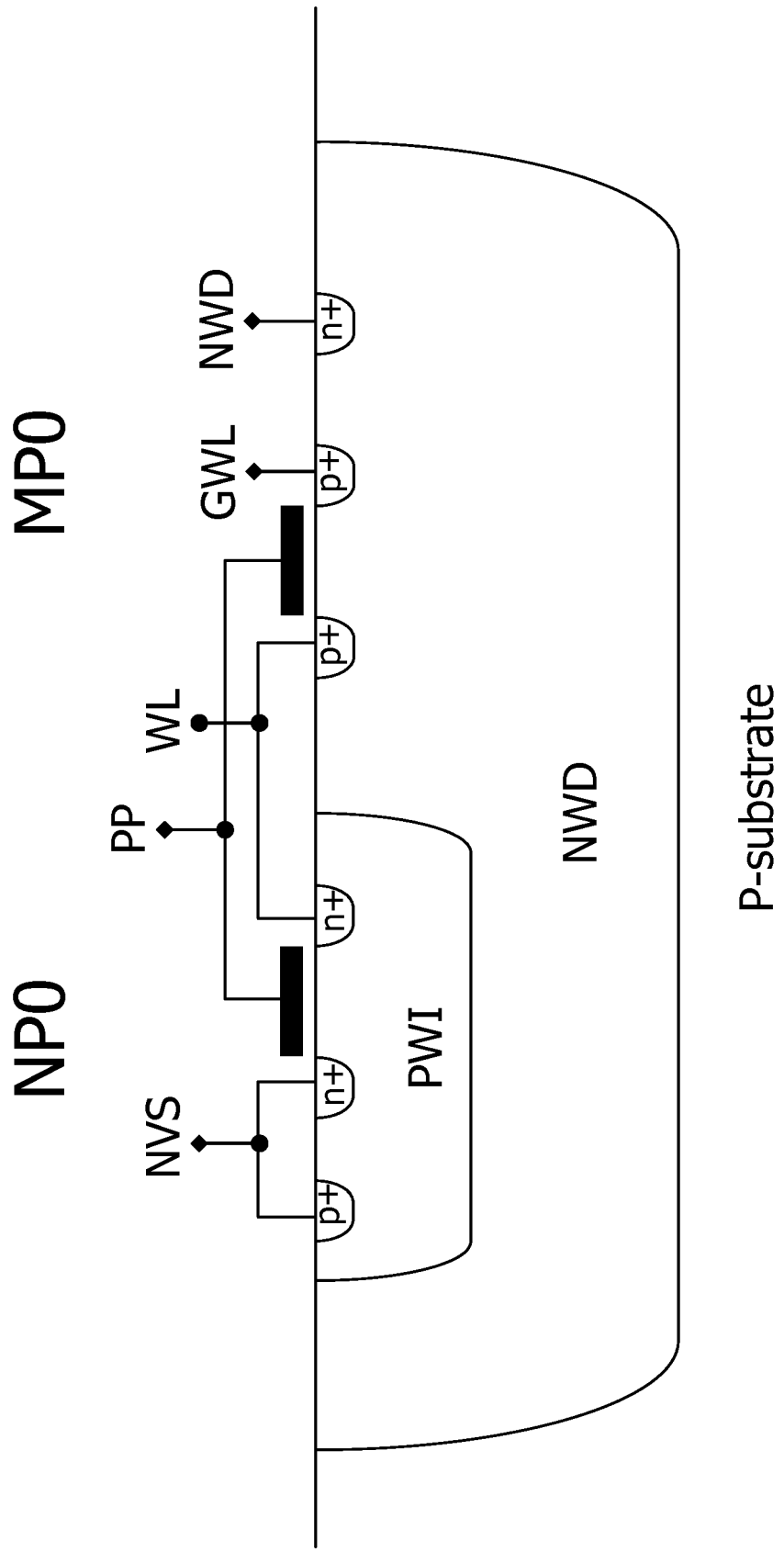
FIG. 16 is a depth cross-section of the 2T word line driver, showing the five voltage nodes of the 2T word line driver.

FIG. 16 is a depth cross-section of the 2T word line driver, showing the five voltage nodes of the 2T word line driver. The p-well implant PWI in the n-well diffusion NWD is shown. The n-well diffusion NWD is formed in the p-type substrate. The n-type transistor NP0 is formed in the p-well implant PWI. The p-type transistor MP0 is formed in the n-well diffusion NWD.

FIG. 17 is a table of an example bias arrangement for the five nodes of the 2T word line driver shown in FIG. 14. The bias arrangements are divided into read or program bias arrangements, and erase bias arrangements. The bias arrangements are further divided into word line select and word line de-select bias arrangements.

Both signal PP and signal GWL are address signals that select or deselect a particular word line corresponding to a particular word line driver. Both signal PP and signal GWL must select a particular word line corresponding to a particular word line driver. De-select occurs if either signal PP or GWL de-selects a particular word line corresponding to a particular word line driver. Accordingly, two de-select bias arrangements are shown among the read or program bias arrangements.

In the first de-select read or program bias arrangement, signal GWL de-selects. The negative PP signal turns off n-type transistor NP0 and turns on p-type transistor MP0. The p-type transistor MP0 electrically connects the signal GWL to the de-selected word line WL.

In the second de-select read or program bias arrangement, signal GWL de-selects. The positive AVXP signal turns on n-type transistor NP0 and turns off p-type transistor MP0. The n-type transistor NP0 electrically connects the signal NVS to the de-selected word line WL.

FIG. 18 is a table of another example bias arrangement for the five nodes of the 2T word line driver shown in FIG. 15. This table is similar to the table of FIG. 17. However, among the read or program bias arrangements, for both the select bias arrangement and the first de-select read or program bias arrangement, the signal PP is 0 V instead of −2 V. The table of FIG. 18 corresponds to the 2T word line driver of FIG. 15, with a depletion mode p-type transistor MP0, rather than an enhance mode p-type device. Accordingly, 0V for the signal PP is sufficient to turn on p-type transistor MP0. This contrasts with the table of FIG. 17 which corresponds to the 2T word line driver of FIG. 14, with an enhance mode p-type transistor MP0, and requires a negative voltage such as −2V to turn on p-type transistor MP0.

FIG. 19 is a table of yet anther example bias arrangement for the 2T word line driver, with a generalized negative voltage.

The signal and node abbreviations and associated voltage ranges are explained as follows:
AVXRD: WL voltage level for read
AVXHV: WL voltage level for program
AVXEV: WL voltage level for erase-verify
AVXNV: −1~−3V from standby negative pump
NV: −8~−11V for erase
AVXP: WL power source
GWL: Global WL power node
PP: PMOS pass gate signal
NVS: negative voltage source FIG. 20 is a simplified block diagram of an array of 2T word line drivers, receiving the signals from multiple lines at the five nodes of the 2T word line drivers in the array, such that the signals select a particular 2T word line driver that drives a particular word line in the subsequent array of word lines.

Figure 20:
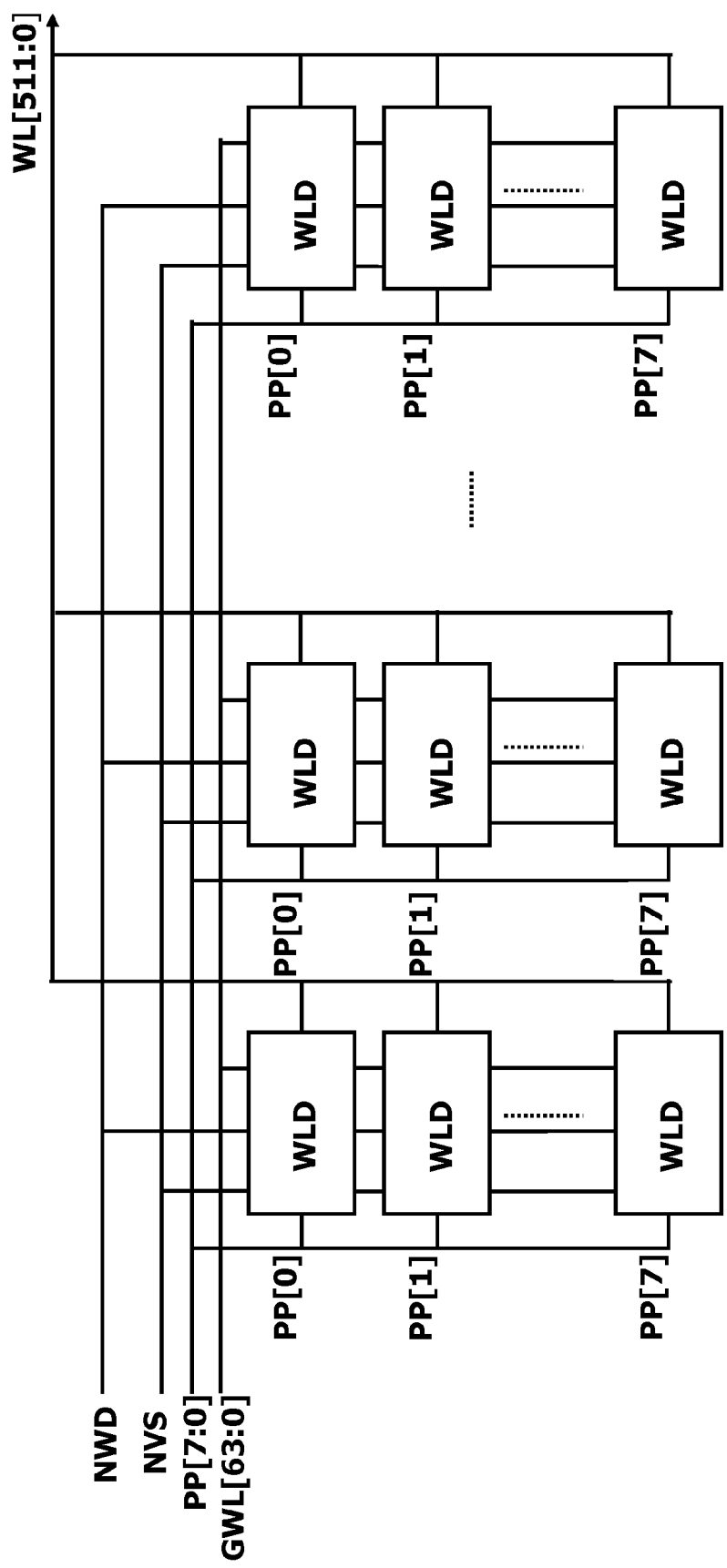
FIG. 20 is a simplified block diagram of an array of 2T word line drivers, receiving the signals from multiple lines at the five nodes of the 2T word line drivers in the array, such that the signals select a particular 2T word line driver that drives a particular word line in the subsequent array of word lines.

The 2T word line driver array is illustrated in FIG. 20 with 64 WLD columns, sharing the same GWL signal but having different PP signals within a column; and with 8 WLD rows sharing the same PP signal but having different GWL signals within a row.

Figure 21:
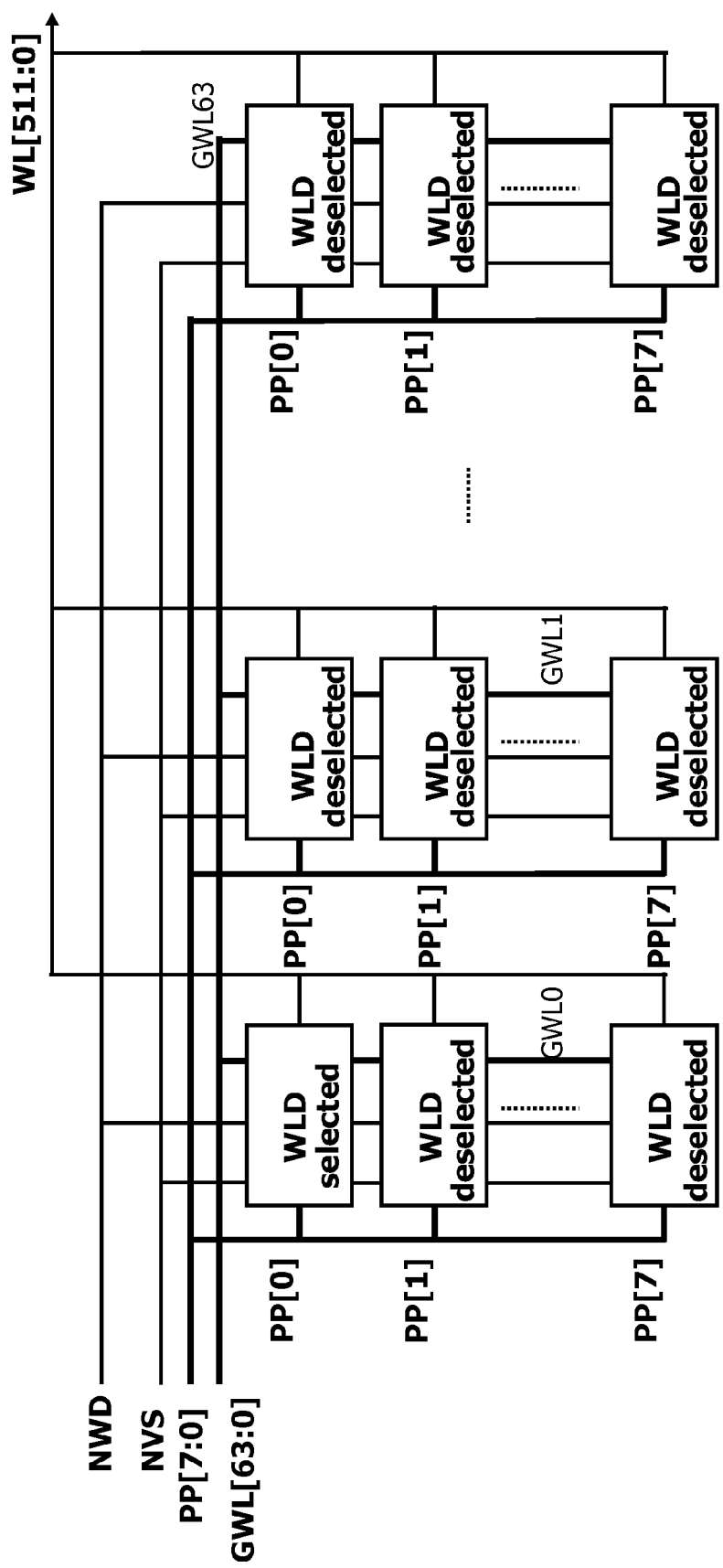
FIG. 21 is the simplified block diagram of an array of 2T word lines drivers of FIG. 7, showing an example addressing arrangement that selects a particular 2T word lines driver from the array, and deselects other 2T word lines driver according to two separate address lines.

FIG. 21 is the simplified block diagram of an array of 2T word lines drivers of FIG. 20, showing an example addressing arrangement that selects a particular 2T word lines driver from the array, and deselects other 2T word lines driver according to two separate address lines.

Both signal PP and signal GWL must select a particular word line corresponding to a particular word line driver. The 2T word line driver array is illustrated in FIG. 20 has signal PP[0] and GWL0 selecting the upper left word line driver, along with the word line corresponding to this word line driver. All other word line drivers (and their corresponding word lines) are deselected.

Figure 22:
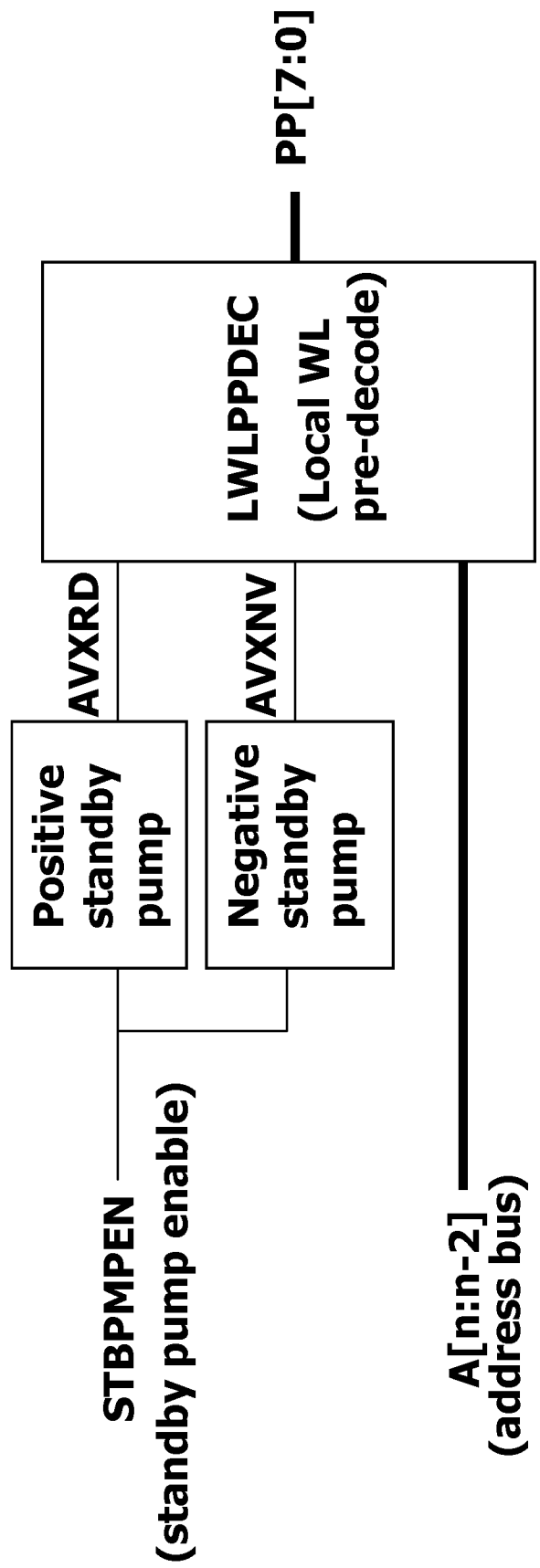
FIG. 22 is the simplified block diagram showing the positive and negative standby pumps that drive the array of 2T word lines drivers.

FIG. 22 is the simplified block diagram showing the positive and negative standby pumps that drive the array of 2T word lines drivers.

Signal STBPMPEN enables or disables the standby pumps. A positive standby pump generates signal AVXRD. A negative standby pump generates signal AVXNV. The negative standby pump is included if read mode does not have sufficient latency for generating negative voltage, and turns on p-type transistor MP0 with a negative voltage. In other words, the negative standby pump is not necessary if the p-type transistor MP0 is depletion mode. An address signal on an address bus is decoded by LWLPPDEC, which performs pre-decoding for local word lines and generates signals PP[7:0].

Figure 23:
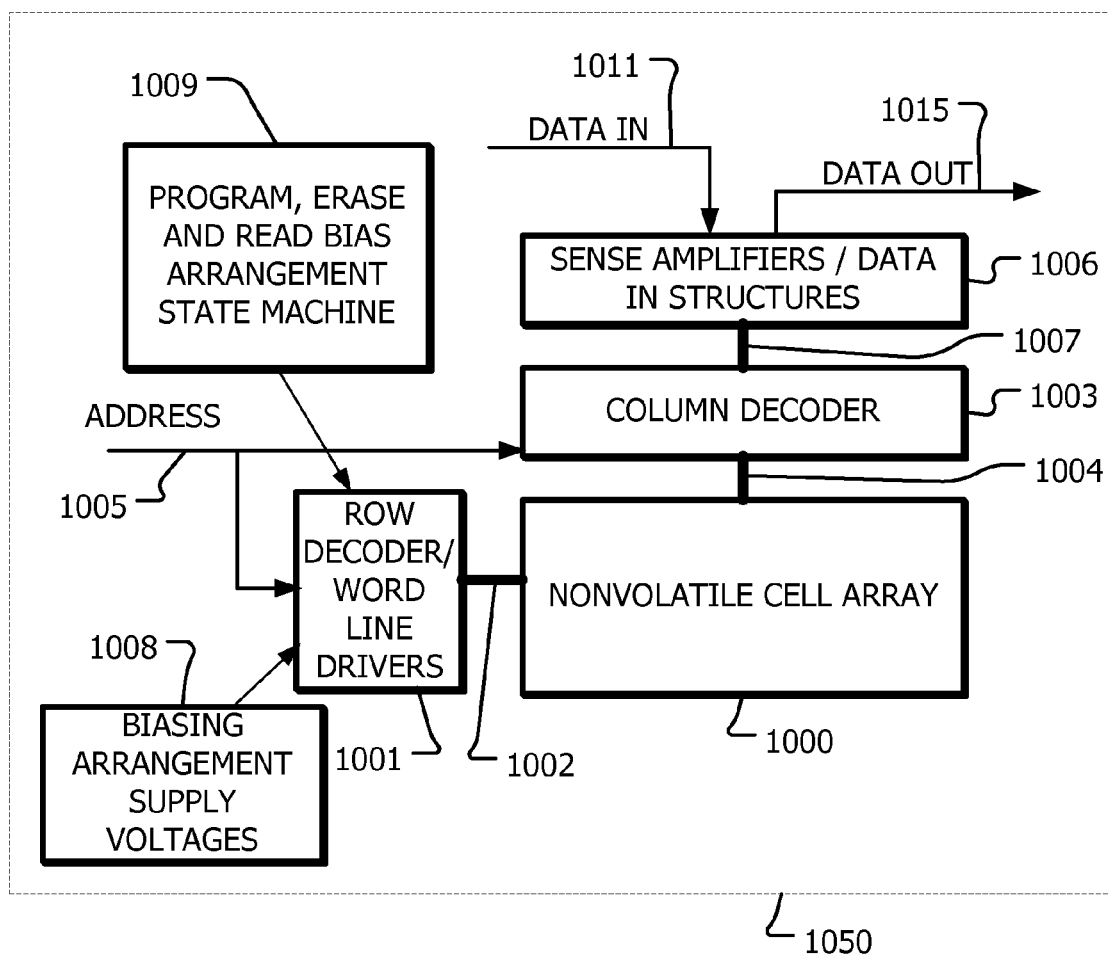
FIG. 23 is a simplified block diagram of an integrated circuit including a memory array implemented using any of the 2T word line driver improvements as described herein.

FIG. 23 is a simplified block diagram of an integrated circuit including a memory array implemented using any of the 2T word line driver improvements as described herein.

FIG. 23 is a simplified block diagram of an integrated circuit 1050 including a memory array 1000. A word line (or row) and block select decoder 1001 is coupled to, and in electrical communication with, a plurality 1002 of word lines and string select lines, and arranged along rows in the memory array 1000. A bit line (column) decoder and drivers 1003 are coupled to and in electrical communication with a plurality of bit lines 1004 arranged along columns in the memory array 1000 for reading data from, and writing data to, the memory cells in the memory array 1000. Addresses are supplied on bus 1005 to the word line decoder and drivers 1001 and to the bit line decoder 1003. Sense amplifiers and data-in structures in block 1006, including current sources for the read, program and erase modes, are coupled to the bit line decoder 1003 via the bus 1007. Data is supplied via the data-in line 1011 from input/output ports on the integrated circuit 1050, to the data-in structures in block 1006. Data is supplied via the data-out line 1015 from the sense amplifiers in block 1006 to input/output ports on the integrated circuit 1050, or to other data destinations internal or external to the integrated circuit 1050. State machine and improved clock circuitry are in circuitry 1009, controlling biasing arrangement supply voltages 1008.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory circuit, comprising:
    a plurality of word line drivers coupled to a plurality of word lines, word line drivers in the plurality including a CMOS driver, the CMOS driver having an input and an output coupled to a word line of the plurality of word lines; and
    control circuitry having at least a first mode to discharge a particular word line of the plurality of word lines via at least a first transistor type of the CMOS driver;
    the control circuitry having at least a second mode to discharge the particular word line of the plurality of word lines via at least a second transistor type of the CMOS driver, the second transistor type different from the first transistor type,
    wherein in the second mode the control circuitry applies a negative voltage to the input of the CMOS driver.

2. The memory circuit of claim 1, wherein the CMOS driver includes a p-type transistor and an n-type transistor, the first transistor type is a p-type transistor, and the second transistor type is an n-type transistor.

3. The memory circuit of claim 2, wherein during the memory operation, the control circuitry prevents discharge of the particular word line via only the p-type transistor of a particular word line driver of the plurality of word line drivers, the particular word line driver coupled to the particular word line.

4. The memory circuit of claim 2, wherein:
    a first reference voltage is coupled to the p-type transistor of the CMOS driver, and the first reference voltage is received from a global word line driver.

5. The memory circuit of claim 2, wherein, in the CMOS driver of the word line drivers, the p-type transistor has a current carrying terminal receiving a first voltage reference signal having one of a first reference value and a second reference value, the first reference value being greater than the second reference value,
    the n-type transistor has a current carrying terminal receiving a second voltage reference signal,
    the control circuitry is configured to deselect word lines of the plurality of word lines by applying first voltage reference signals to the current carrying terminals of p-type transistors in the plurality of the word line drivers, and
    the control circuitry is configured to deselect word lines of the plurality of word lines by applying input signals to inputs of CMOS drivers in the plurality of the word line drivers.

6. The memory circuit of claim 2, wherein, during the memory operation, the control circuitry is configured to select the selected word line of the plurality of word lines by coupling the selected word line to the first reference value via a word line driver of the plurality of word line drivers, and deselect word lines adjacent to the word line by coupling the adjacent word lines to the second voltage reference signal via word line drivers of the plurality of word line drivers.

7. The memory circuit of claim 1, wherein consecutive operations changing a word line voltage of the particular word line are separated by sufficient time to discharge the particular word line.

8. The memory circuit of claim 1, wherein during the memory operation, the control circuitry reads one or more memory cells coupled to the selected word line.

9. The memory circuit of claim 1, wherein during the memory operation, the control circuitry does not read memory cells coupled to the particular word line.

10. The memory circuit of claim 1, wherein the selected word line is coupled to a word line driver of the plurality of word lines drivers, and the selected word line is charged to the read voltage, responsive to the first voltage reference signal and the second voltage reference signal.

11. The memory circuit of claim 1, wherein the particular word line is deselected to perform a read operation on one or more memory cells not coupled to the particular word line.

12. The memory circuit of claim 1, wherein the selected word line is selected to perform a read operation on one or more memory cells coupled to at least the selected word line.

13. The memory circuit of claim 1, wherein, during a memory operation on a selected word line of the plurality of word lines, the control circuitry is configured to deselect the particular word line adjacent to the selected word line, via the second mode and not the first mode.

14. A method of operating memory, comprising:
    during a memory operation on a selected word line of a plurality of word lines, deselecting a particular word line adjacent to the selected word line, via not a first mode of control circuitry and via a second mode of the control circuitry, wherein
    in the first mode the control circuitry is configured to discharge the particular word line of the plurality of word lines via a first discharge path including a n-type transistor having a positive of a word line driver of a plurality of word line drivers,
    in the second mode the control circuitry is configured to discharge the particular word line of the plurality of word lines via a second discharge path including a p-type transistor having a negative gate voltage of the word line driver of the plurality of word line drivers.

15. The method of claim 1, wherein the p-type transistor has a first current carrying terminal connected to the particular word line and second current carrying terminal connected in the second mode to the discharge voltage, and wherein the negative gate voltage is negative relative to the discharge voltage; and the n-type transistor has a first current carrying terminal connected to the particular word line and second current carrying terminal connected in the first mode to the discharge voltage, and wherein the positive gate voltage is positive relative to the discharge voltage.

16. The method of claim 15, wherein during the memory operation, the control circuitry prevents discharge of the particular word line via only the p-type transistor of a particular word line driver of the plurality of word line drivers, the particular word line driver coupled to the particular word line.

17. The method of claim 15, wherein:
    a first reference voltage is coupled to the p-type transistor, and the first reference voltage is received from a global word line, the first reference voltage is the discharge voltage in the second mode.

18. The method of claim 15, wherein, in the word line drivers, the p-type transistor has a current carrying terminal receiving a first voltage reference signal having one of a first reference value and the discharge value, the first reference value being greater than the discharge value.

19. The method of claim 14, wherein consecutive operations changing a word line voltage of the word line are separated by sufficient time to discharge the word line.

20. The method of claim 14, wherein during the memory operation, the control circuitry reads one or more memory cells coupled to the selected word line.

21. The method of claim 14, wherein during the memory operation, the control circuitry does not read memory cells coupled to the particular word line.

22. The method of claim 14, wherein the selected word line is coupled to a word line driver of the plurality of word lines drivers, and the selected word line is charged to the read voltage, responsive to the first voltage reference signal and the second voltage reference signal.

23. The method of claim 14, wherein the particular word line is deselected to perform a read operation on one or more memory cells not coupled to the particular word line.

24. The method of claim 14, wherein the selected word line is selected to perform a read operation on one or more memory cells coupled to at least the selected word line.

25. A memory circuit, comprising:
a plurality of word line drivers coupled to a plurality of word lines, word line drivers in the plurality including:
a p-type transistor having a current carrying terminal receiving a first voltage reference signal having one of a first reference value and a second reference value, the first reference value being greater than the second reference value; and
an n-type transistor having a current carrying terminal receiving a second voltage reference signal,
wherein the p-type transistor and the n-type transistor are electrically coupled together as a CMOS driver, the CMOS driver having an input and an output coupled to a word line of the plurality of word lines; and
control circuitry configured to deselect word lines of the plurality of word lines by applying first voltage reference signals to the current carrying terminals of p-type transistors in the plurality of the word line drivers, and
the control circuitry configured to deselect word lines of the plurality of word lines by applying input signals to inputs of CMOS drivers in the plurality of the word line drivers,
wherein, during a memory operation, the control circuitry is configured to deselect a particular word line adjacent to a selected word line, by coupling the particular word line to the second voltage reference signal via the current carrying terminals of p-type transistor in a particular word line driver of the plurality of word line drivers and applying a negative input voltage to the input of the particular word line driver.

26. The memory circuit of claim 25, wherein consecutive operations changing a word line voltage of the word line are separated by sufficient time to discharge the word line.

27. The memory circuit of claim 25, comprising:
wherein, during the memory operation, the control circuitry is configured to deselect the particular word line by coupling the particular word line to the second voltage reference signal via at least the n-type transistor of the word line driver.

* * * * *